(12) United States Patent
Kim

(10) Patent No.: US 7,982,503 B2
(45) Date of Patent: Jul. 19, 2011

(54) DYNAMIC CIRCUIT WITH SLOW MUX INPUT

(75) Inventor: Min-Su Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/814,635

(22) Filed: Jun. 14, 2010

(65) Prior Publication Data

US 2010/0315126 A1 Dec. 16, 2010

(51) Int. Cl.
*H03K 19/096* (2006.01)
(52) U.S. Cl. .............................. 326/98; 326/93; 327/200
(58) Field of Classification Search .................... 326/98, 326/95, 93; 327/200, 218, 212, 214, 219
See application file for complete search history.

(56) References Cited

U.S. PATENT DOCUMENTS 5,917,355 A * 6/1999 Klass ............................ 327/208
6,448,829 B1 * 9/2002 Saraf ............................ 327/200

FOREIGN PATENT DOCUMENTS

JP 11-068549 3/1999

* cited by examiner

*Primary Examiner* — Daniel D Chang
(74) *Attorney, Agent, or Firm* — Stanzione & Kim, LLP

(57) ABSTRACT

A logic circuit includes a control circuit including a first logic gate to receive a selection signal and a first input signal and to output a pulse control signal and a second logic gate to receive the pulse control signal, a clock signal, and a delayed clock signal and to output a pulse signal, and a multiplexing logic circuit to receive the selection signal and the pulse signal from the control circuit, to receive at least one second, static input signal, and to output a signal corresponding to one of the first input signal and the second, static input signal based on the state of the selection signal.

30 Claims, 14 Drawing Sheets

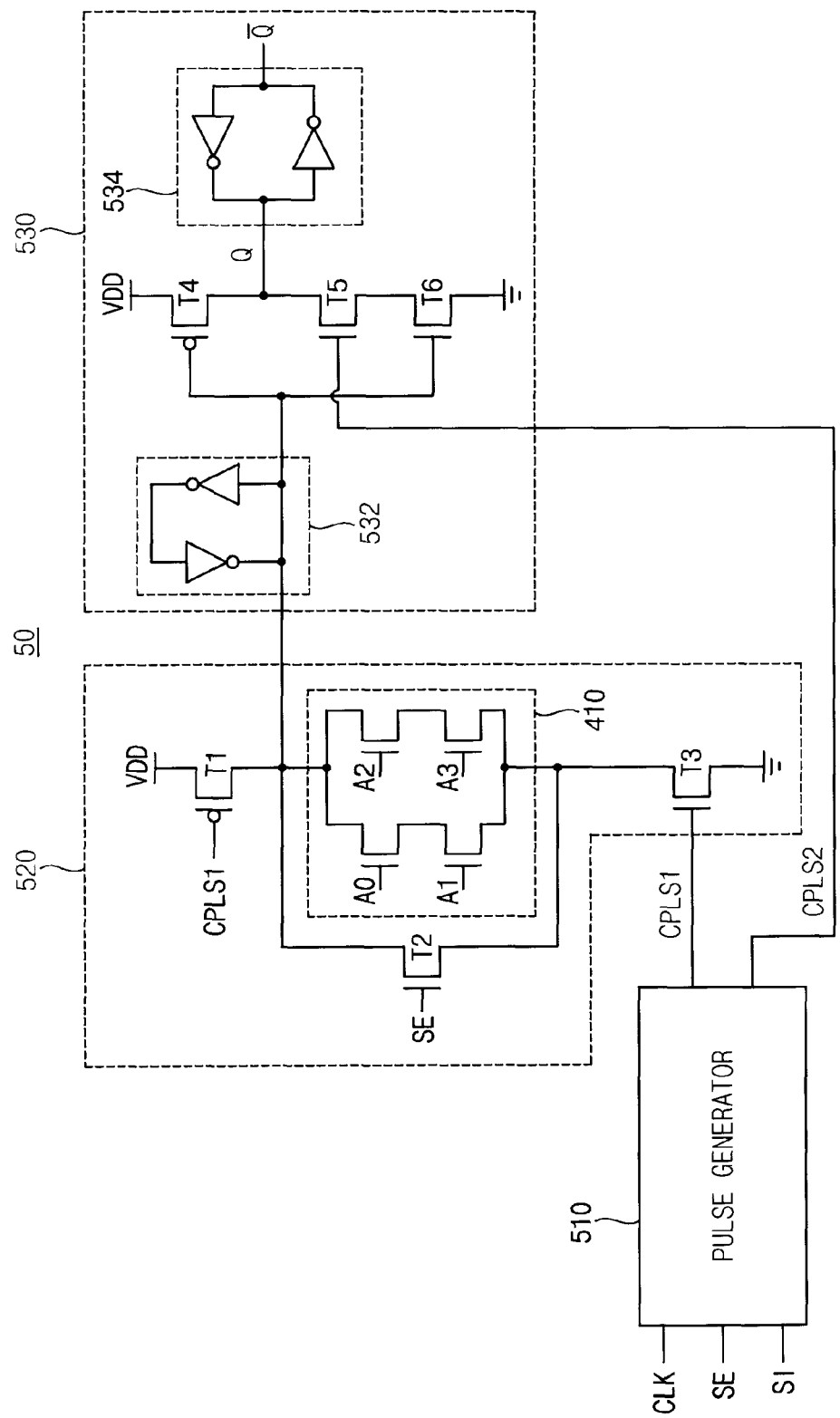

DYNAMIC CIRCUIT WITH SLOW MUX INPUT

CROSS-REFERENCE TO RELATED APPLICATIONS

This U.S. non-provisional patent application claims priority under 35 U.S.C. §119 of Korean Patent Application No. 10-2009-0053304, filed on Jun. 16, 2009, the entire contents of which are hereby incorporated by reference.

BACKGROUND

1. Field of the Invention

The present disclosure herein relates to digital signal processing, and more particularly, to a dynamic circuit receiving as an input a slow signal.

2. Description of the Related Art

Semiconductor devices, and processors in particular, continue to decrease in size relative to the amount of data processed. As data speed and volume increase, it becomes challenging to keep power consumption of the semiconductor device low.

High-performance circuits may utilize dynamic circuitry to increase processing speed. System clocks have jitter, or variations in high or low levels, especially during rising and falling edges of the clock signal. While static circuitry may be affected by jitter, dynamic circuitry is not affected to the same extent. While static circuitry utilizes signals that are locked in at a rising (or falling) clock signal and held for a duration of a high or low clock period, dynamic circuitry allows a signal to rise or fall during a clock high (or low) period, and the signal is held until the next changing clock edge. For example, in the dynamic circuit if the input signal is low at a rising clock edge but changes to a high level during the high level of the clock, an output signal may be changed to high and held at a high level until the falling edge of the clock. Dynamic logic allows a circuit to operate with a higher processing speed, but may also consume more power than a static logic circuit.

One such semiconductor device is a cascode logic circuit having a MUX input. FIG. 1A illustrates a block diagram of a cascode logic circuit 100 having a MUX input. The cascode logic circuit 100 may include a pre-charge circuit 2 to pre-charge an output node. A logic unit 4 may receive inputs, perform a logic function, and output a signal to the cascode logic circuit output based on the logic function. An input unit 6 may receive at least one input and output a signal to the cascode logic circuit output based on the received input. Each of the logic unit 4 and input unit 6 may include at least one latch, 4a and 6a, connected to a clock signal to latch and hold an input signal value at a rising edge of the clock signal. A selection unit 8 may select one of the logic unit 4 and input unit 6 to output to the cascode logic circuit output.

FIG. 1B illustrates a schematic diagram of the cascode logic circuit in FIG. 1A. The pre-charge unit 2 corresponds to a transistor P1 having a source connected to a power source VDD and a gate connected to the clock signal CLK. When the CLK signal is low, the transistor P1 may pre-charge the node 21. NMOS transistors N1-N4 receive inputs A-D. When a select signal S and a clock signal CLK are high, transistors N6 and N8 are turned on, and the signals A-D input to the logic unit 4 are evaluated. In the example illustrated in FIG. 1B, if all of the transistors N1-N4 are turned on, the voltage at the node 21 is driven low, and the output Q is driven high, so that the logic unit acts as an AND gate. However, any configuration of transistors may be used to generate a desired logic function.

When the select signal S is low, transistor N7 is turned on, and input E is output. For example, if input E is high, transistor N5 is turned on, driving node 21 low and driving output Q high. Thus, the selection signal S acts as a MUX selection signal to determine which one of the logic inputs and the input E is output to the output of the cascode logic circuit.

Since the cascode logic circuit 100 receives input signals of static circuits, the signals A-E and S must be held by latches L1-L6 for the duration of a high CLK signal. The latches take up circuit space and may also contribute to a circuit delay. In addition, since all of the logic unit 4, the selection transistor N6 and the clock transistor N8 are located on a path between power VDD and ground, they may all contribute to a signal delay. Specifically, since resistance and capacitance in an electrical path contribute to signal delay, each transistor adds resistance to the signal path.

A cascode logic circuit 100 may malfunction if the inputs A-E are static inputs on the critical path and the input E is a slow input on a non-critical path. A critical path is defined as a path in which the path delay comprises a high percentage of a clock cycle, such as 80%-90% of a clock cycle. A "critical" input signal is an input signal along the critical path.

A "slow" input is defined as an input having a delay greater than a delay of the clock signal CLK. The above definition of a "slow" input is applied throughout the specification and claims. For example, if a delay of the input E causes the input signal E to enter the latch L5 after a clock CLK rising edge has passed, then the input E will delay operation of the cascode logic circuit 100 by a clock cycle.

SUMMARY

The present general inventive concept provides a cascode logic circuit having a slow MUX input.

Additional features and utilities of the present general inventive concept will be set forth in part in the description which follows and, in part, will be obvious from the description, or may be learned by practice of the general inventive concept.

Features and/or utilities of the present general inventive concept may be realized by a logic circuit including a control circuit including a first logic gate to receive a selection signal and a first input signal and to output a pulse control signal and a second logic gate to receive the pulse control signal, a clock signal, and a delayed clock signal and to output a pulse signal, and a multiplexing logic circuit to receive the selection signal and the pulse signal from the control circuit, to receive at least one second, static input signal, and to output a signal corresponding to one of the first input signal and the second, static input signal based on the state of the selection signal.

The first input signal may be a slow input signal.

The first and second logic gates may be NAND gates, and the delayed clock signal may be generated by a buffer including a plurality of inverters connected in series to receive the clock signal and to output the delayed clock signal.

The multiplexing logic circuit may include a logic unit to receive the static input, a first NMOS transistor connected in parallel with the logic unit, a gate of the first NMOS transistor connected to a line to carry the selection signal, and a second NMOS transistor connected in series with the parallel combination of the first NMOS transistor and the logic unit and connected to a line to carry the pulse signal. Each of the first NMOS transistor and the logic unit may include a first lead connected to an electrical node corresponding to an output of the logic circuit. Each of the first NMOS transistor and the logic unit may include a second lead connected to a first lead of the second NMOS transistor, and the second NMOS transistor may include a second lead connected to ground.

The first input may correspond to a signal from the electrical node.

The logic circuit may further include an output latch including first and second inverters connected input-to-output, a first input-to-output connection connected to the electrical node, and a second input-to-output connection corresponding to the first input of the control circuit.

The logic circuit may further include a latch circuit to receive an input signal from the second input-to-output connection of the output latch and to output a signal to the first input of the control circuit.

The logic circuit may further include a pre-charge circuit to pre-charge the electrical node corresponding to an output of the logic circuit.

The logic circuit may further include a first output latch to receive a signal from the electrical node corresponding to the output of the logic circuit and to output a signal to the electrical node corresponding to the signal received from the electrical node signal, and an output buffer to receive the signal from the electrical node and to output a corresponding output signal.

The logic circuit may further include a first output latch to receive a signal from the electrical node corresponding to the output of the logic circuit and to output a signal to the electrical node corresponding to the signal received from the electrical node signal, and a second output latch to receive the signal from the electrical node and a timing signal and to output an output signal.

The output latch may include first, second, and third NMOS transistors connected in series between power and ground, the first and third NMOS transistors receiving as gate inputs the signal from the electrical node and the second NMOS receiving as a gate input signal the timing signal, and two inverters connected input-to-output, a first input-to-output connection connected between a drain of the first NMOS transistor and a source of the second NMOS transistor, and a second input-to-output connection outputting an output signal from the logic circuit.

The timing signal may be the pulse signal from the control circuit.

The timing signal may be a second pulse signal generated by the control circuit.

Features and/or utilities of the present general inventive concept may also be realized by a logic circuit including a control circuit to receive a first input signal, a clock signal, and a selection signal, to output the selection signal, and to output a pulse signal based on the clock input signal and a pulse control signal, and a multiplexing logic circuit receive the selection signal and the pulse signal from the control circuit, to receive at least one second, static input signal, and to output a signal corresponding to one of the first input and the second, static input based on the state of the selection signal. The multiplexing logic circuit may include a logic unit to receive the static input, a first NMOS transistor connected in parallel with the logic unit, a gate of the first NMOS transistor connected to receive the selection signal, and a second NMOS transistor connected in series with the parallel combination of the first NMOS transistor and the logic unit, and connected to receive the pulse signal. Each of the first NMOS transistor and the logic unit may include a first lead connected to an electrical node corresponding to an output of the logic circuit. Each of the first NMOS transistor and the logic unit may include a second lead connected to a first lead of the second NMOS transistor, and the second NMOS transistor may include a second lead connected to ground.

The control circuit may include a pulse-generator circuit to generate the pulse signal.

The pulse-generator circuit may include a first logic gate to receive the selection signal and the first input and to output the pulse control signal, and a second logic gate to receive the pulse control signal, the clock signal, and a delayed clock signal and to output the pulse signal.

Features and/or utilities of the present general inventive concept may also be realized by a method of performing a multiplexing operation, the method including receiving a first input signal, a selection signal, and a clock signal at a control circuit, generating a pulse control signal based on the first input signal and the selection signal, generating a pulse signal based on the pulse control signal, receiving at least one static input signal, the selection signal, and the pulse signal at a MUX logic circuit, the MUX circuit including a first transistor connected in parallel with a logic unit, the first transistor receiving at its gate the selection signal and the logic unit receiving as an input the at least one static input signal, and outputting from the MUX logic circuit a first output signal corresponding to one of the first input signal and the static input signal based on a state of the selection signal.

The first input signal may be a slow input signal.

Generating the pulse control signal may include receiving at a NAND logic gate each of the first input signal and the selection signal to output the pulse control signal from the NAND logic gate, generating the delayed clock signal may include passing the clock signal through a buffer, and generating the pulse signal may include receiving each of the pulse control signal, the clock signal, and the delayed clock signal into a NAND logic gate.

The first input signal may be connected to the output of the MUX logic circuit.

A rise of the pulse signal corresponds to a respective rise of the clock signal.

The MUX logic circuit further may include a second NMOS transistor connected in series with the parallel combination of the first NMOS transistor and the logic unit, and each of the first NMOS transistor and the logic unit may include a first lead connected to an electrical node corresponding to an output of the logic circuit, each of the first NMOS transistor and the logic unit may include a second lead connected to a first lead of the second NMOS transistor, the second NMOS transistor may include a second lead connected to ground, and the method further may include outputting the pulse signal to a gate of the second NMOS transistor.

The method may further include pre-charging the electrical node during a low portion of the clock signal. Pre-charging the electrical node may include inputting the clock signal to a gate of a PMOS transistor connected in series with the combination of the logic unit and first NMOS transistor connected in parallel.

The method may further include receiving the first output signal and a timing signal as inputs to a latch input, and outputting from the latch a second output signal corresponding to the first output signal.

The timing signal may be the pulse signal.

The latch may include first, second, and third NMOS transistors connected in series between power and ground, and two inverters connected input-to-output, a first input-to-output connection connected between a drain of the first NMOS transistor and a source of the second NMOS transistor. The method further may include receiving the signal from the electrical node at gates of the first and third NMOS transistors, receiving the pulse signal at a gate of the second NMOS transistor, inputting a third output signal to the first input-to-output connection, and outputting the second output signal from the second input-to-output connection.

Features and/or utilities of the present general inventive concept may also be realized by a method of performing a multiplexing operation, the method including receiving a first input signal, a selection signal, and a clock signal at a control circuit, generating a pulse control signal based on the first input signal and the selection signal, generating a pulse signal corresponding to an output of a NAND logic gate, the NAND logic gate receiving as inputs the clock signal, a delayed clock signal, and the pulse control signal, receiving at least one static input signal, the selection signal, and the pulse signal as inputs of a MUX logic circuit, and outputting from the MUX logic circuit a first output signal corresponding to one of the first input signal and the static input signal based on a state of the selection signal.

Features and/or utilities of the present general inventive concept may also be realized by a semiconductor chip including at least one logic circuit, the logic circuit including a control circuit including a first logic gate to receive a selection signal and a first input signal and to output a pulse control signal and a second logic gate to receive the pulse control signal, a clock signal, and a delayed clock signal and to output a pulse signal, and a multiplexing logic circuit to receive the selection signal and the pulse signal from the control circuit, to receive at least one second, static input signal, and to output a signal corresponding to one of the first input signal and the second, static input signal based on the state of the selection signal.

Features and/or utilities of the present general inventive concept may also be realized by a computing device, including memory to store data and at least one controller to read data from and write data to the memory. At least one of the memory and controller may include a logic circuit, the logic circuit including a control circuit including a first logic gate to receive a selection signal and a first input signal and to output a pulse control signal and a second logic gate to receive the pulse control signal, a clock signal, and a delayed clock signal and to output a pulse signal, and a multiplexing logic circuit to receive the selection signal and the pulse signal from the control circuit, to receive at least one second, static input signal, and to output a signal corresponding to one of the first input signal and the second, static input signal based on the state of the selection signal.

BRIEF DESCRIPTION OF THE DRAWINGS

The accompanying drawings are included to provide a further understanding of the general inventive concept, and are incorporated in and constitute a part of this specification. The drawings illustrate exemplary embodiments of the general inventive concept and, together with the description, serve to explain principles of the general inventive concept.

FIG. 5A illustrates another embodiment of a dynamic circuit according to the present general inventive concept.

DETAILED DESCRIPTION OF THE EMBODIMENTS

Preferred embodiments of the general inventive concept will be described below in more detail with reference to the accompanying drawings. The embodiments of the general inventive concept may, however, be embodied in different forms and should not be constructed as limited to the embodiments set forth herein. Rather, these embodiments are provided so that this disclosure will be thorough and complete, and will fully convey the scope of the general inventive concept to those skilled in the art. Like numbers refer to like elements throughout.

Figure 2A:
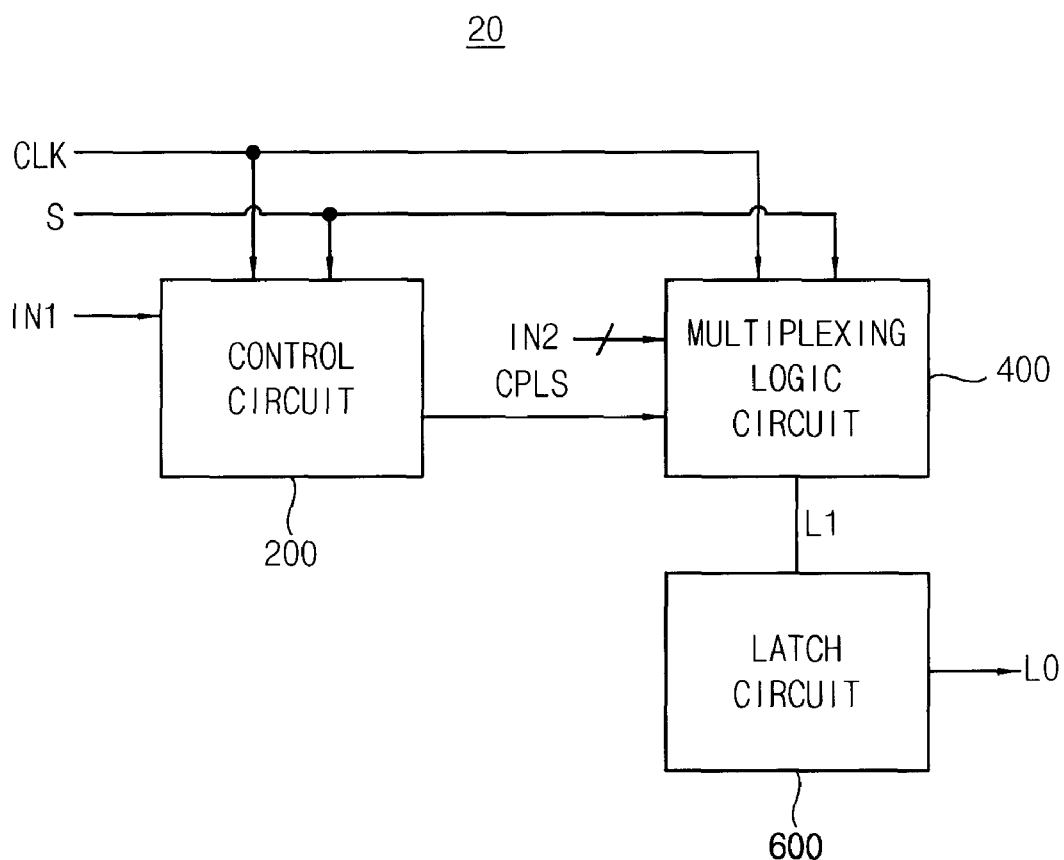
FIG. 2A illustrates a block diagram of a cascode logic circuit 200 according to an embodiment of the present general inventive concept.

FIG. 2A illustrates a block diagram of a dynamic circuit 20 including a control circuit 200, a multiplexing logic circuit 400 and a latch circuit 600. The control circuit receives a non-critical, slow input signal IN1, a clock signal CLK, and a multiplex select signal S, and outputs a clock pulse signal CPLS. The multiplexing logic circuit receives the clock signal CLK, the multiplex select signal S, the clock pulse signal CPLS, and one or more input signals IN2, and outputs a multiplex output signal L1. The latch circuit 600 receives the multiplex output signal L1 and outputs a latch output signal L0, which is also the dynamic circuit output signal.

Figure 2B:
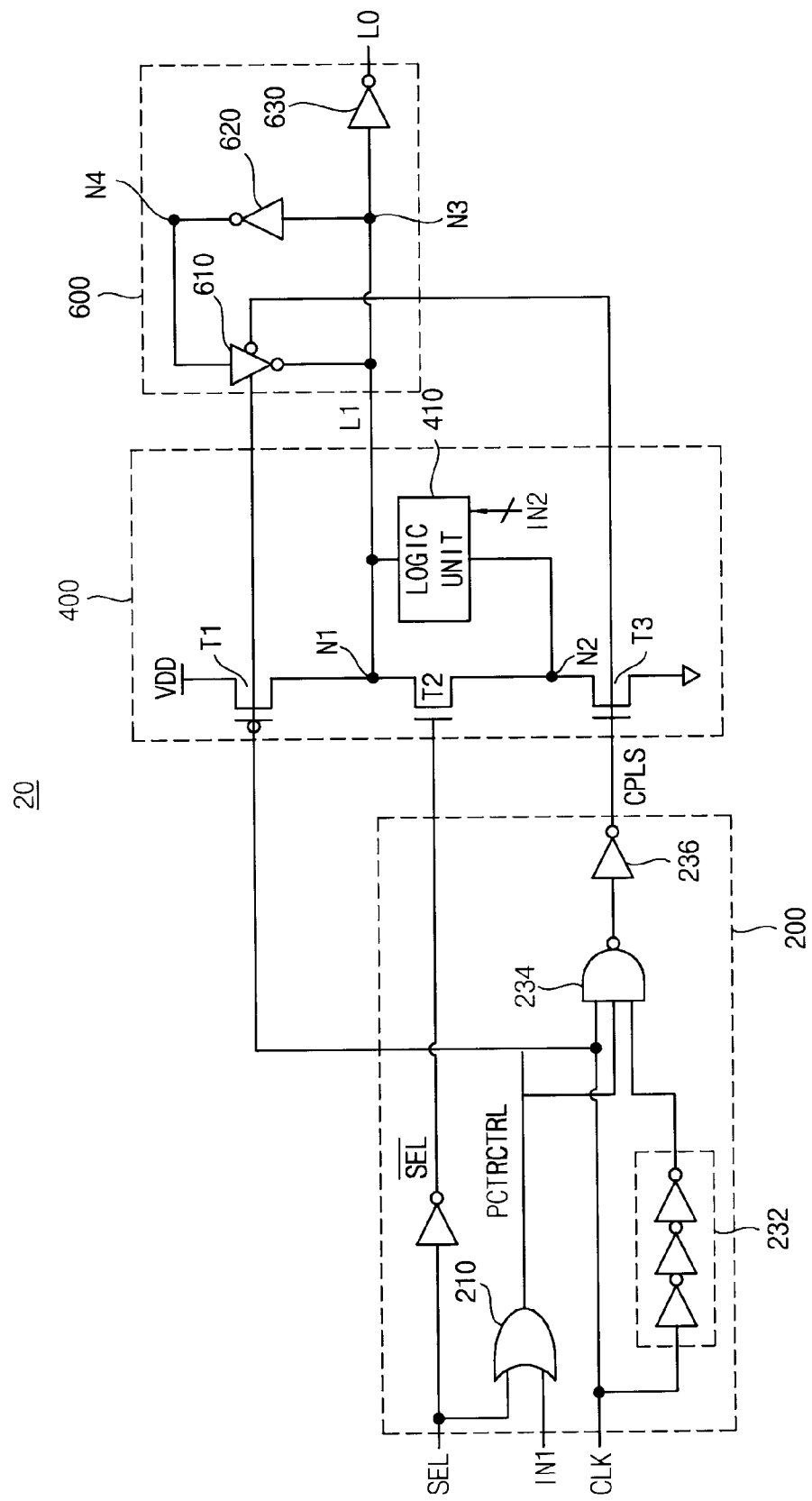
FIG. 2B illustrates a schematic diagram of a dynamic circuit according to an embodiment of the present general inventive concept.
Figure 3A:
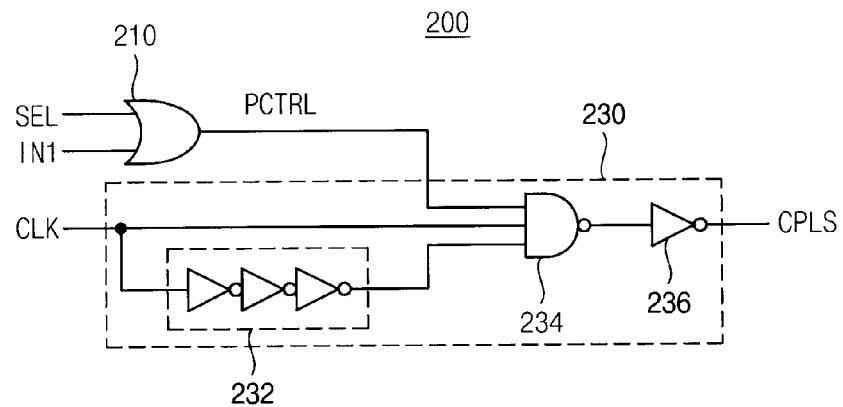
FIG. 3A illustrates a logic/schematic diagram of a control circuit according to the present general inventive concept.
Figure 3B:
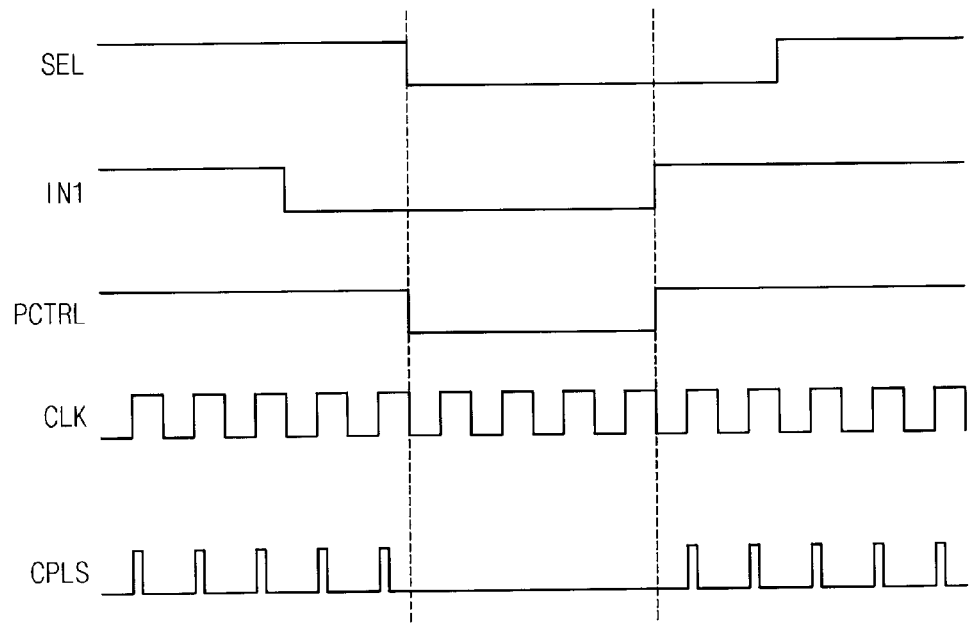
FIG. 3B illustrates a timing diagram of the control circuit.

FIG. 2B illustrates a logic circuit diagram of an embodiment of the dynamic circuit of FIG. 2A. FIG. 3A illustrates the logic of the control circuit 200 of FIG. 2B, and FIG. 3B illustrates a timing diagram of the control unit 200. The control circuit 200 includes an OR gate 210 to receive the multiplex select signal SEL and the input signal IN1 and to output a pulse control signal PCTRL. The pulse control signal PCTRL is input into the clock pulse generating unit 230 to output the clock pulse signal CPLS. A NAND gate 234 receives the pulse control signal PCTRL, the clock signal CLK, and a delayed clock signal having passed through a clock delay circuit 232. The clock delay circuit 232 may include a series of inverters connected input-to-output, or it may include any other appropriate circuit. A clock pulse signal CPLS is output high (H) from the control circuit 200 when both the clock signal CLK and the delayed clock signal are at a high (H) level, and when one of the multiplex select signal S and the first input signal is at a high (H) level. FIG. 3B illustrates a timing diagram of the control circuit 200. Once the clock signal CLK is driven high (H), the clock signal CLK is input into the clock delay circuit 232. The time that it takes the signal to pass through the clock delay circuit 232 defines the duration of the clock pulse high signal CPLS, because once the output of the clock delay circuit 232 is driven low (L), the output of the NAND gate 234 is driven high (H) and after the signal is passed through the inverter 236, the output of the control circuit 200 is driven low (L), ending the high level (H) of the clock pulse signal CPLS.

In addition, when both the multiplex select signal SEL and the input signal IN1 are in at a low level (L), the output of the NAND gate 234 is high (H) and the output of the control circuit 200 is low (L), which turns off the clock pulse signal CPLS for the duration of the low (L) SEL and IN1 signals (i.e. when both signals are low (L)).

The clock pulse signal CPLS may turn on the transistor T3 of the multiplexing logic circuit 400 to allow a current to flow from node N2 to ground, depending upon the state of the logic unit 410 and the transistor T2. For example, if the logic unit 410 comprises an AND gate of two transistors connected in series, source-to-drain, current will flow through the logic circuit to the transistor T3 only when each of the transistors of the logic gate 410 is turned on.

The multiplexing logic circuit 400 includes a pre-charge transistor T1 having a gate connected to the clock signal CLK, such that when the clock signal is low (L), the transistor T1 is on and current flows into the node N1 to pre-charge the node N1 at a high voltage (H) state.

In addition, the multiplexing logic circuit includes the transistor T2 connected in parallel with the logic unit 410. A gate of the transistor T2 may be connected to a signal corresponding to an inverted multiplex select signal (SELN). Throughout the specification, an inverted signal may be represented by adding an "N" to the end of the signal name. In the figures, the inverted signal may be represented by adding an "N" to the end of the signal name or by adding a bar above the signal name. Thus, when SEL is low (L), SELN is high (H), transistor T2 is turned on, and the logic unit 410 is not evaluated. Instead, a state of the input signal IN1 is output.

Specifically, if IN1 is high (H), then the node N1 is discharged, because the transistor T2 and the transistor T3 are on. The discharged node N1 has a low (L) voltage value, and the voltage L0 output from the dynamic circuit has a high (H) voltage value. However, if the input IN1 is low (L), then no clock pulse signal CPLS is generated, transistor T3 is not turned on, and the pre-charged state of the node N1 is maintained. Thus, the output L0 of the dynamic circuit 20 is a low voltage (L) corresponding to the voltage level of the input IN1.

Figure 1A:
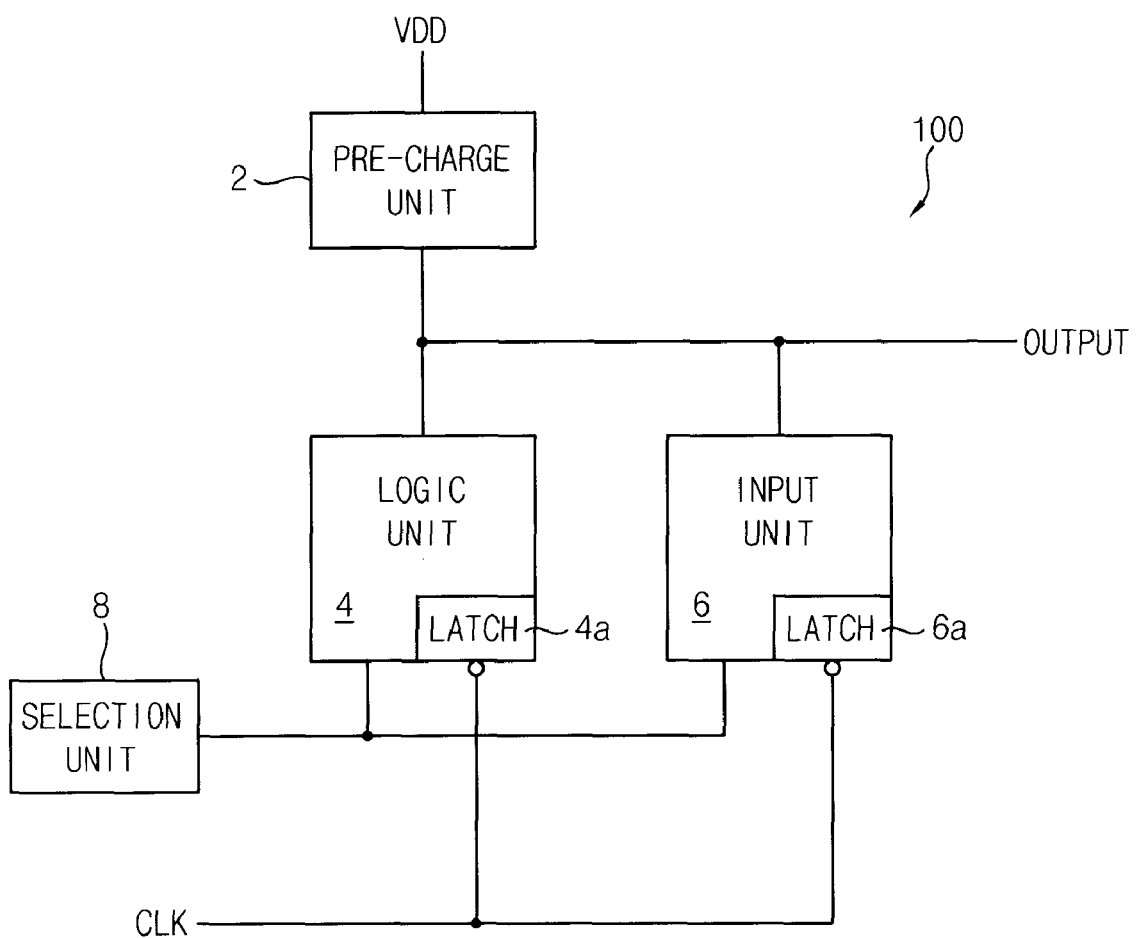
FIG. 1A illustrates a block diagram of a cascode logic circuit.
Figure 1B:
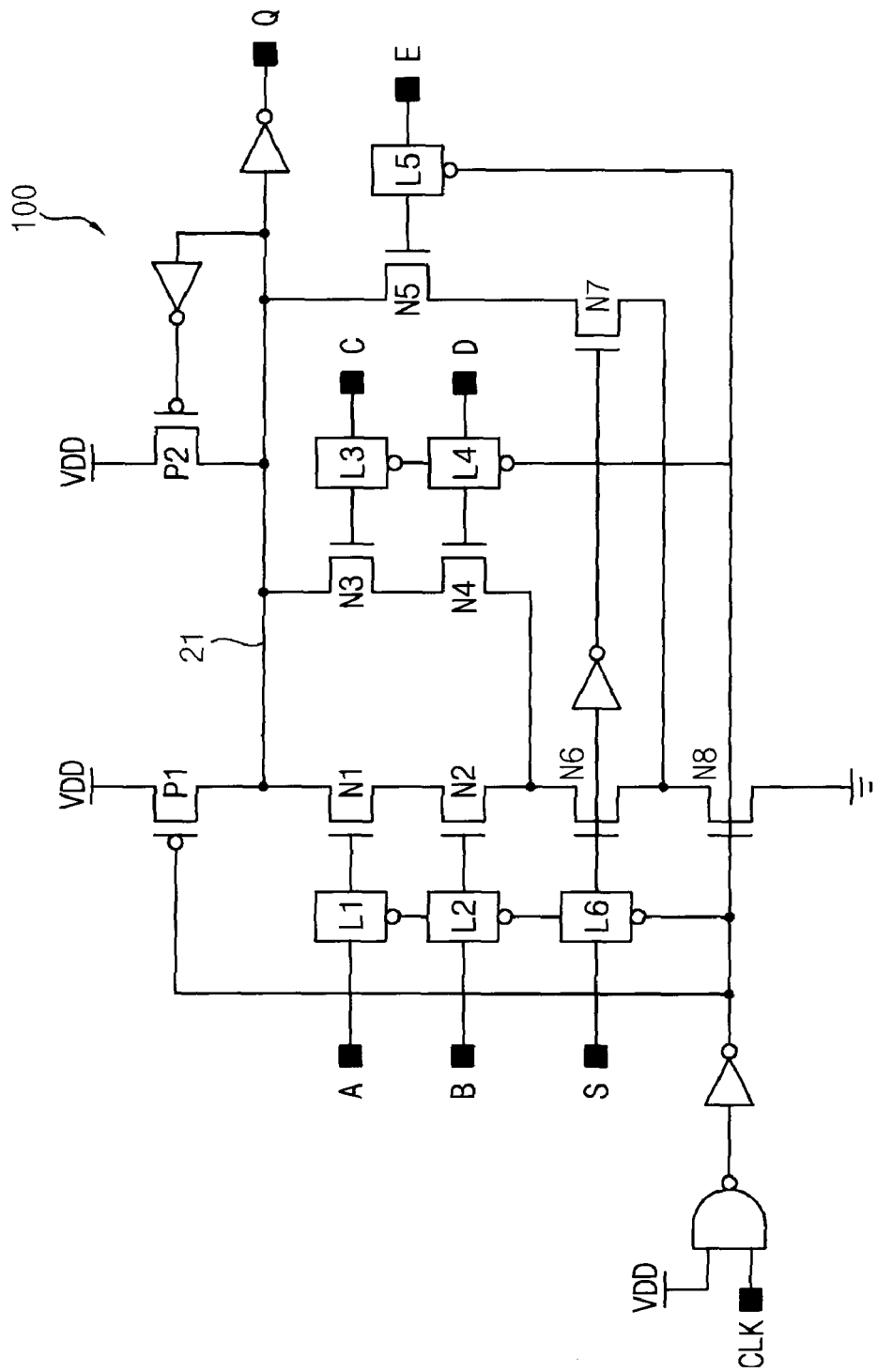
FIG. 1B illustrates a schematic diagram of the cascode logic circuit of FIG. 1A.

Since the clock pulse signal CPLS turns off the transistor T3 after a clock delay period determined by the clock delay circuitry 232, the voltage states of the node N1 may be maintained for the duration of the clock high (H) period without the use of one or more latches to latch input signals. In addition, the use of the clock pulse signal CPLS to control the transistor T3 allows the multiplexing logic circuit 400 to perform the same multiplexing function as the circuit illustrated in FIG. 1B but with fewer transistors along the critical path between the node N1 and ground. As a result, the delay of signals along the critical path may be reduced compared to the circuit of FIG. 1B and similar circuits.

The latch circuit 600 latches and holds the output of the dynamic circuit 20. Specifically, the voltage level of the node N1 is input into the inverter 620. The gate 610 receives the output from the inverter 620 and outputs an output level corresponding to the opposite voltage level of the output of the inverter 620 when the clock signal CLK is high and the pulse signal CPLS is low. In other words, the gate 610 maintains the voltage level of the node N1 while the clock level CLK is high (H) and the pulse CPLS is low (L). The inverter 630 outputs a signal opposite the voltage level of the node N1. However, the inverter 630 may be omitted from the circuit or replaced by an output latch circuit, such as the output circuit illustrated in FIG. 5A and described below, according to embodiments of the present general inventive concept. In other words, the present general inventive concept is not limited to a circuit including an inverter 630.

Figure 4:
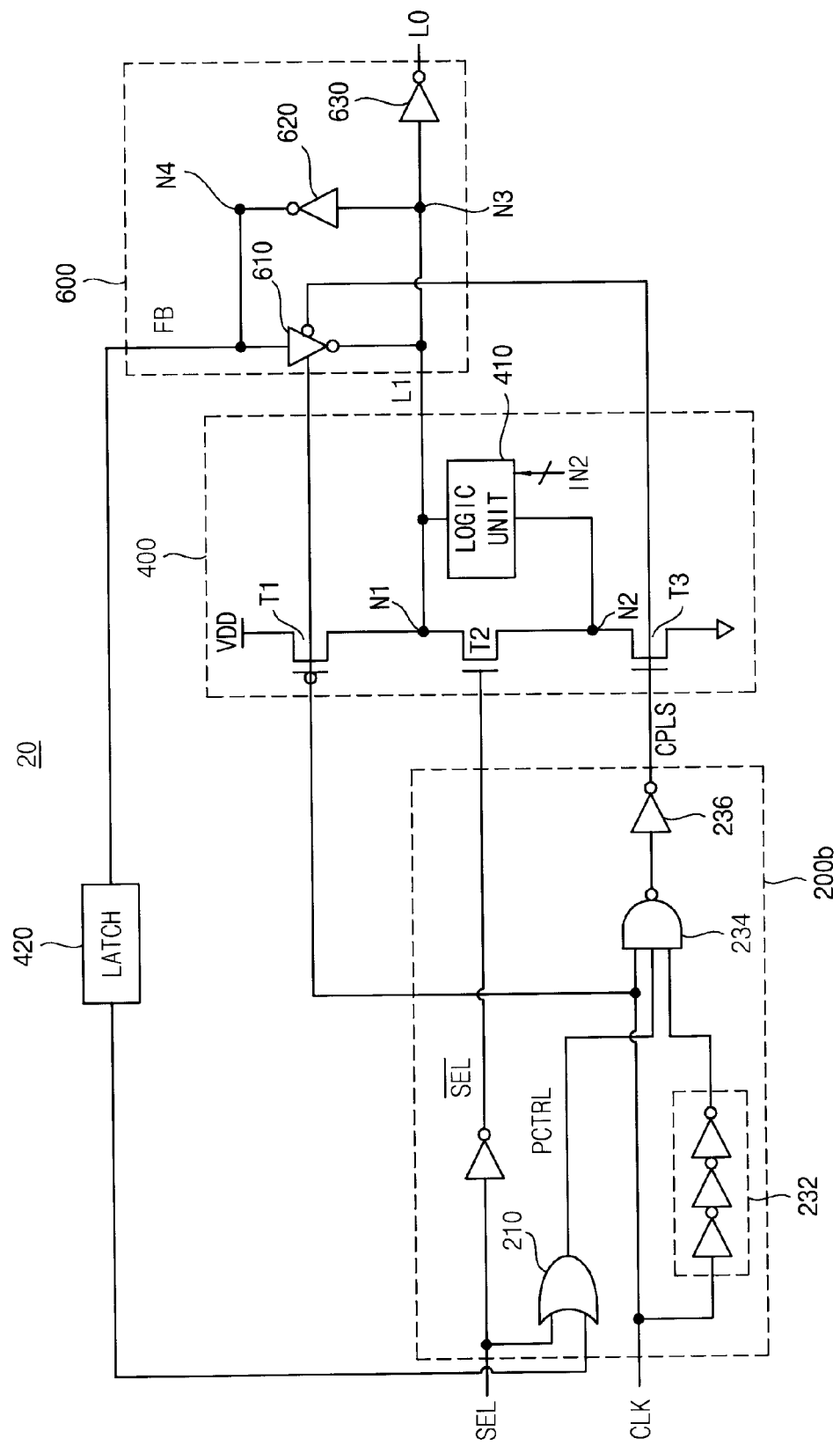
FIG. 4 illustrates a timing diagram according to the present general inventive concept.

FIG. 4 is similar to the logic circuit of FIG. 2B, except the input signal IN1 is a feedback signal FB from the latch circuit 600. In FIG. 4, a latch 420 is connected between the output latch circuit 600 and the input OR gate 210 of the control circuit 200. The latch 420 receives a signal corresponding to a state of the node N1, holds the signal for the duration of the high clock signal CLK and outputs the signal to the input OR gate 210. When the multiplex select signal SEL is low (L), the level of the feedback signal FB is output from the dynamic circuit 20.

FIG. 5A illustrates a circuit diagram according to an embodiment of the present general inventive concept in which a second pulse signal is output to the output latch circuit. In FIG. 5A, the input signal IN1 is replaced with a scan input signal SI, and the multiplex select signal SEL is replaced with the scan enable signal SE. A scanning function allows a circuit to be evaluated by providing given inputs to the circuit and then evaluating whether the given inputs are propagated to later stages of the circuit.

The dynamic circuit 50 includes a pulse generator circuit 510 to output first and second pulse signals CPLS1 and CPLS2. The pulse generator 510 receives a clock signal CLK, the scan enable signal SE, and a scan input signal SI and outputs the first and second pulse signals CPLS1, CPLS2 depending on the states of the input signals. When the scan enable signal SE is low, or when both the scan enable signal SE and the scan input signal SI are high, both the first and second pulse signals CPLS1, CPLS2 may be active. On the other hand, when the scan enable signal SE is high and the scan input signal SI is low, the first pulse signal CPLS1 may be turned off and the second pulse signal CPLS2 may be turned on. A pulse signal is "active" or "on" when an output of the pulse generator 510 corresponds to a voltage level of the pulse signal. For example, when the pulse signal CPLS1 is on or active, then the output CPLS1 will be high when both the clock signal CLK and the delayed inverted clock signal are high, and the output CPLS1 will be low when one of the clock signal CLK and the delayed inverted clock signal is low. On the other hand, when the pulse signal is inactive, it remains in a given voltage state (either high or low depending on the circuit design) regardless of the states of the clock signal CLK and the delayed inverted clock signal.

A chart of the relationship between inputs and outputs of the pulse generator 510 is shown below.

|  | SE | SI | CPLS1 | CPLS2 |
| --- | --- | --- | --- | --- |
| Scan Function | H | H | On | On |
| On/Evaluate SI | H | L | Off | On |
| Scan Function | L | H | On | On |
| Off/Evaluate Logic | L | L | On | On |

The first pulse signal CPLS1 corresponds to the pulse signal CPLS of FIG. 2B. It may be connected to the gate of transistor T3 of the multiplex logic circuit 520. The multiplex logic circuit 520 corresponds to the multiplex logic circuit 400 of FIG. 2B. The logic unit 410 of the multiplex logic circuit 520 may include a plurality of transistors or other logic elements. Although the circuit of FIG. 5 illustrates four transistors, any appropriate number or configuration may be used, depending on the desired logic. Inputs A0-A3 of the logic unit 410 may correspond to signals received from external circuits or devices, for example.

The dynamic circuit 50 may include output latch circuitry 530. A first output latch 532 may latch the state of the node N21. A second latch 534 may latch and output a state of the dynamic circuit output Q and the inverse of Q (i.e., "Q-not," or QN). Transistor T4 may act as an inverter to output a voltage level to the output Q that is the opposite of the node N21. For example, when node N21 is at a high level, the transistor T4 may be turned off, and the output Q may be driven low, depending on the state of the second pulse signal CPLS2. On the other hand, when the voltage level of the node N21 is low, the transistor T4 may be turned on, and the voltage VDD may be applied to the output Q to drive the output high.

Transistor T5 receives the second pulse signal CPLS2 and turns on the transistor T5 only for the period of the pulse. During the period of the pulse, if the voltage level of the node N21 is high, then transistor T6 is turned on, and the output Q is driven low. Once the pulse ends, the output Q is maintained in a low state by the latch 534 and the off state of the transistor T5. On the other hand, if, during the period of the pulse, the voltage level of the node N21 is low, then transistor T4 is turned on to apply a high voltage to the output Q, which is maintained by the latch 534 since the transistor T6 is turned off. Once the pulse ends, the voltage level of the output Q is maintained by the latch since the transistor T5 is turned off.

Based on the operation described above, the circuit may act as a scan-enabled flip-flop circuit to dynamically latch and hold voltage levels of inputs. The scan input signal SI may be a slow input signal that would not delay the operation of the logic along the critical path between node N21 and ground.

Figure 5B:
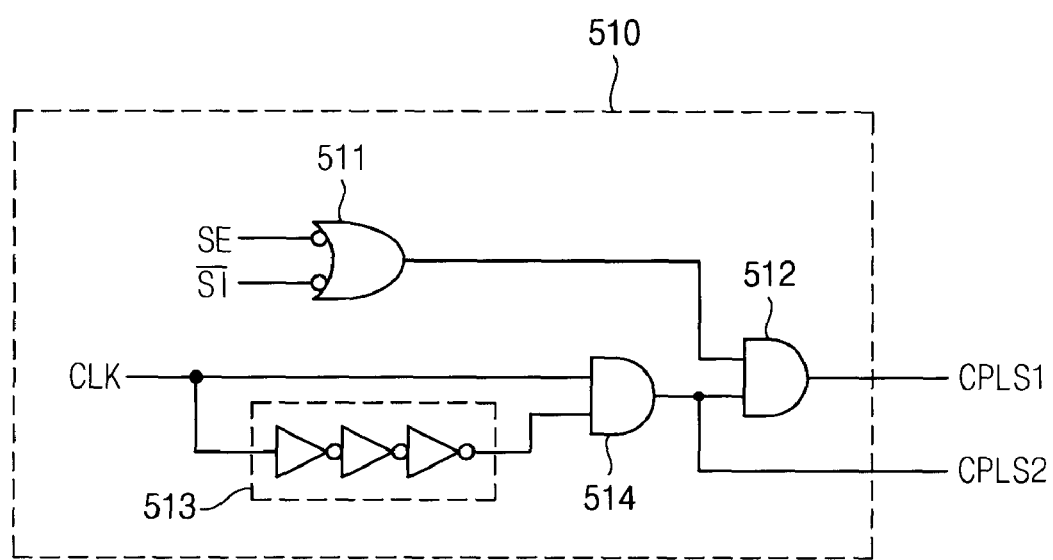
FIG. 5B illustrates an example pulse generator.

FIG. 5B illustrates an example of logic circuitry within the pulse generator 510. The scan enable SE and an inverted scan input SIN signal may be input into a NAND gate 511. An output of the NAND gate 511 may be input into an AND gate 512 which generates a first clock pulse signal CPLS1. The other input of the AND gate 512 may be connected to a second clock pulse signal CPLS2. The second clock pulse signal CPLS2 is generated by receiving the clock signal CLK and a delayed clock signal, delayed via the delay circuit or buffer circuit 513, at an AND gate 514 which outputs the second clock pulse signal CPLS2.

Figure 5C:
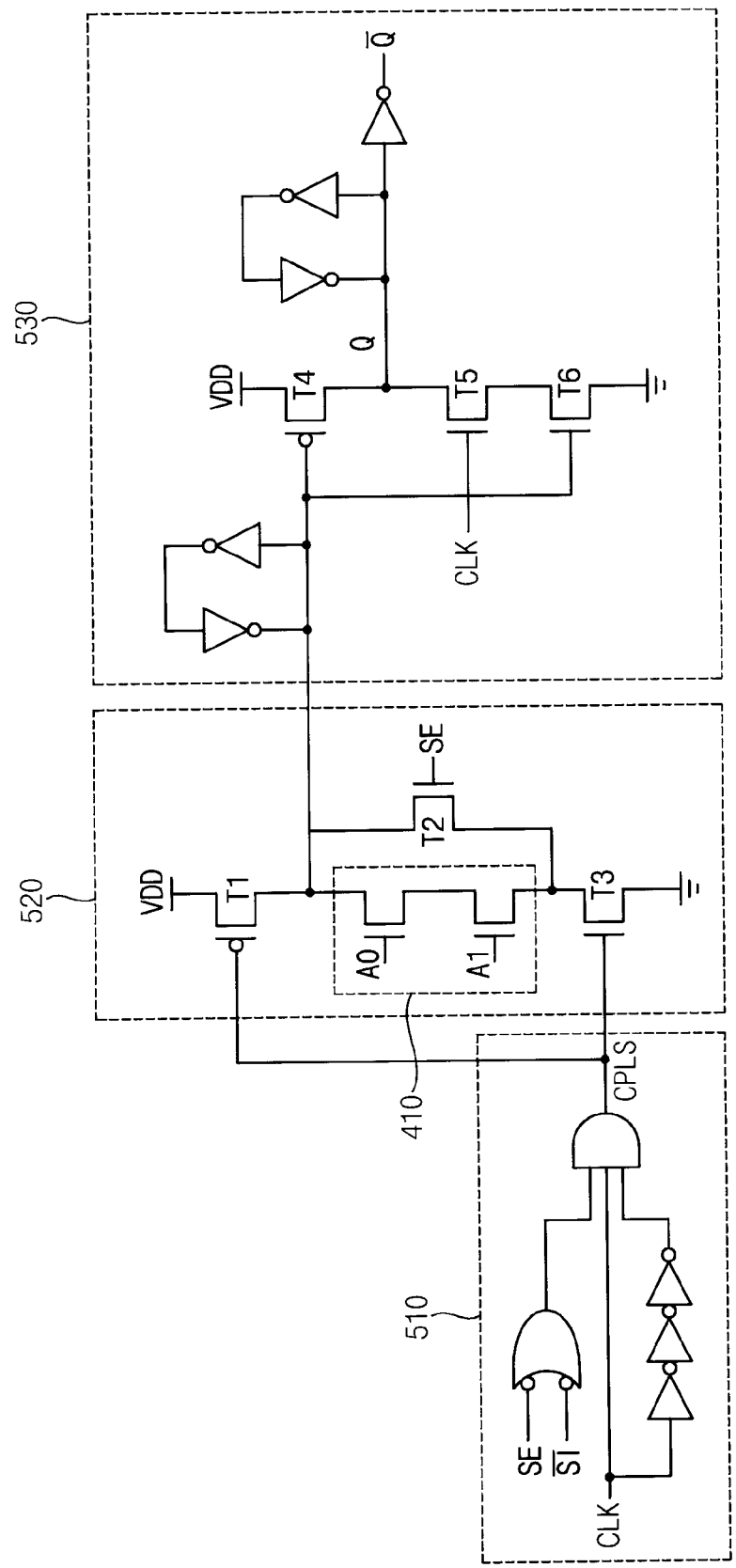
FIGS. 5C and 5D illustrate embodiments of dynamic circuits according to the present general inventive concept.

FIG. 5C illustrates another embodiment of the present general inventive concept in which the transistor T5 of the output latch circuitry 530 receives the clock signal CLK as a gate input rather than the second pulse signal CLPS2. In addition, although not shown in FIG. 5C, pre-charge transistor T1 may receive the clock signal CLK as an input at its gate rather than receiving the clock pulse signal CPLS.

Figure 5D:
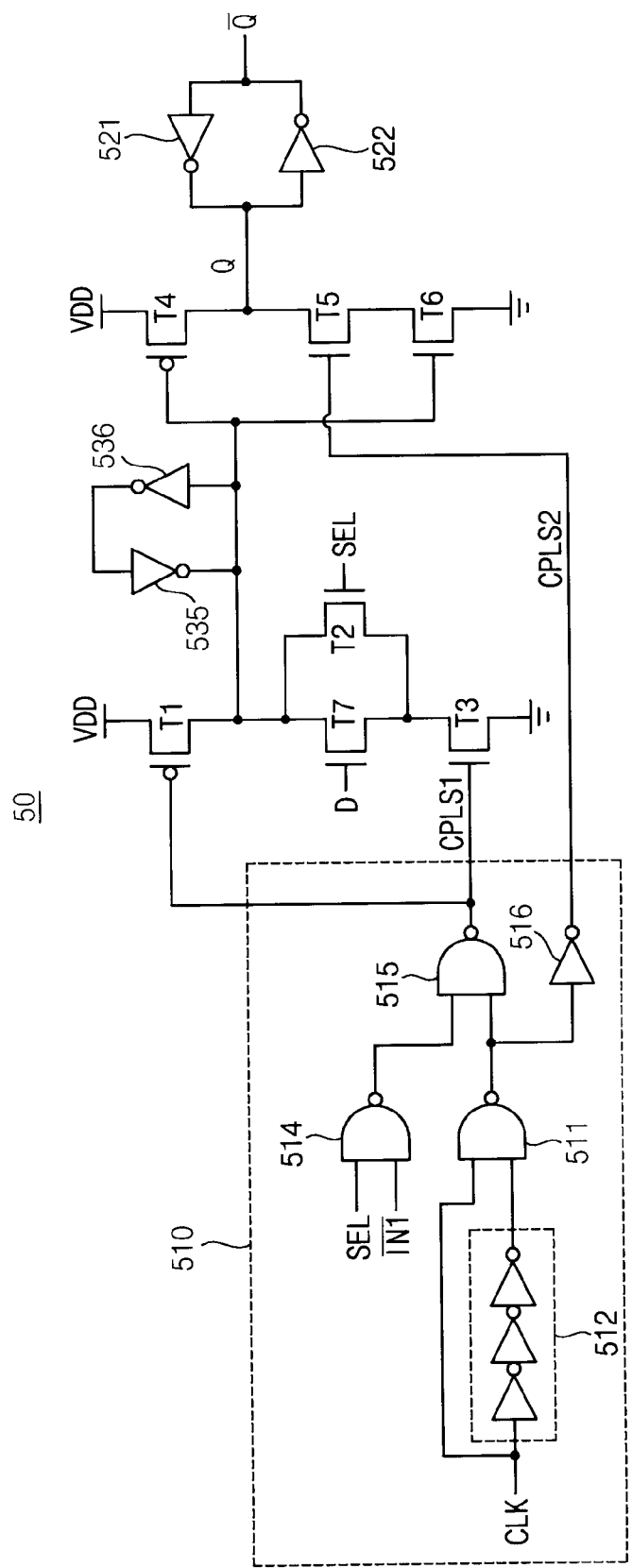
Figure 6:
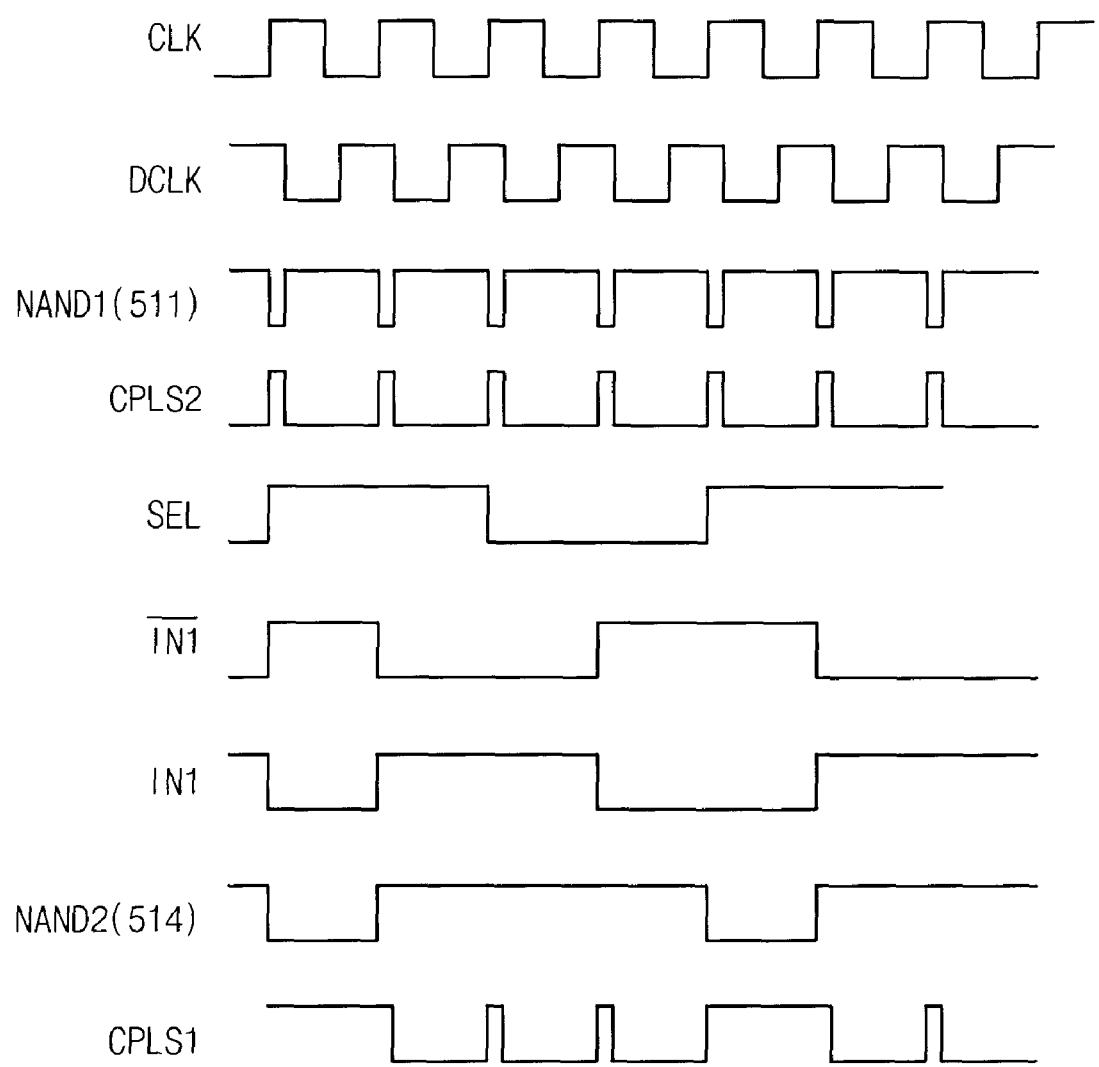
FIG. 6 illustrates a timing diagram of the dynamic circuit of FIG. 5D.

FIG. 5D illustrates a logic circuit similar to that of FIG. 5A. However, instead of a logic unit 410, the multiplexing logic unit 520 receives an input D, which allows the dynamic circuit 50 to function as a multiplexer and dynamic-type D flip-flop. FIG. 6 illustrates a timing diagram of the pulse generator 510 of FIG. 5D.

The pulse generator 510 may include an NAND gate 511 to receive the clock signal CLK and the delayed and inverted clock signal, having passed through the clock delay circuit 512, and to output a high clock pulse signal CPLS2 via inverter 516 only when both the clock signal CLK and the delayed clock signal are at a high voltage level. The clock pulse signal CPLS2 is input into a NAND gate 515. The other input of the NAND gate 515 is connected to another NAND gate 514 that receives as inputs a multiplex selection signal SEL and an inverted input signal IN1N. In other words, the NAND gate 514 is driven low only when the multiplex selection signal SEL is high and the input signal IN1 is low.

When the pulse CPLS1 is low, transistor T1 is turned on, and the node N21 is pre-charged. When the pulse CPLS1 is high, the transistor T3 is turned on. The state of the D signal may be analyzed. If the selection signal SEL is high, then the transistor T2 is turned on, and the node N21 is driven low. If the second pulse signal CPLS2 is high, then the output Q is driven low and the output QN is driven high.

If the selection signal SEL is low, then transistor T2 is turned off. In such a case, the level of the input signal D is analyzed. If the signal D is low, transistor T7 is turned off. Consequently, node N21 is maintained at a pre-charged high level and transistor T4 is turned off and transistor T6 is turned on. If the second pulse signal CPLS2 is high, then transistor T5 is turned on, the output Q is driven low, and the output QN is driven high. If the second pulse signal CPLS2 is low, transistor T5 is turned off, and the outputs Q and QN are maintained at their previous levels.

On the other hand, if the input signal D is high, then transistor T7 is turned on, node N21 is driven low, transistor T4 is turned on, and transistor T6 is turned off. Since the transistor T6 is turned off, then the outputs Q and QN are maintained at their previous levels regardless of the level of the second pulse signal CPLS2.

Figure 7:
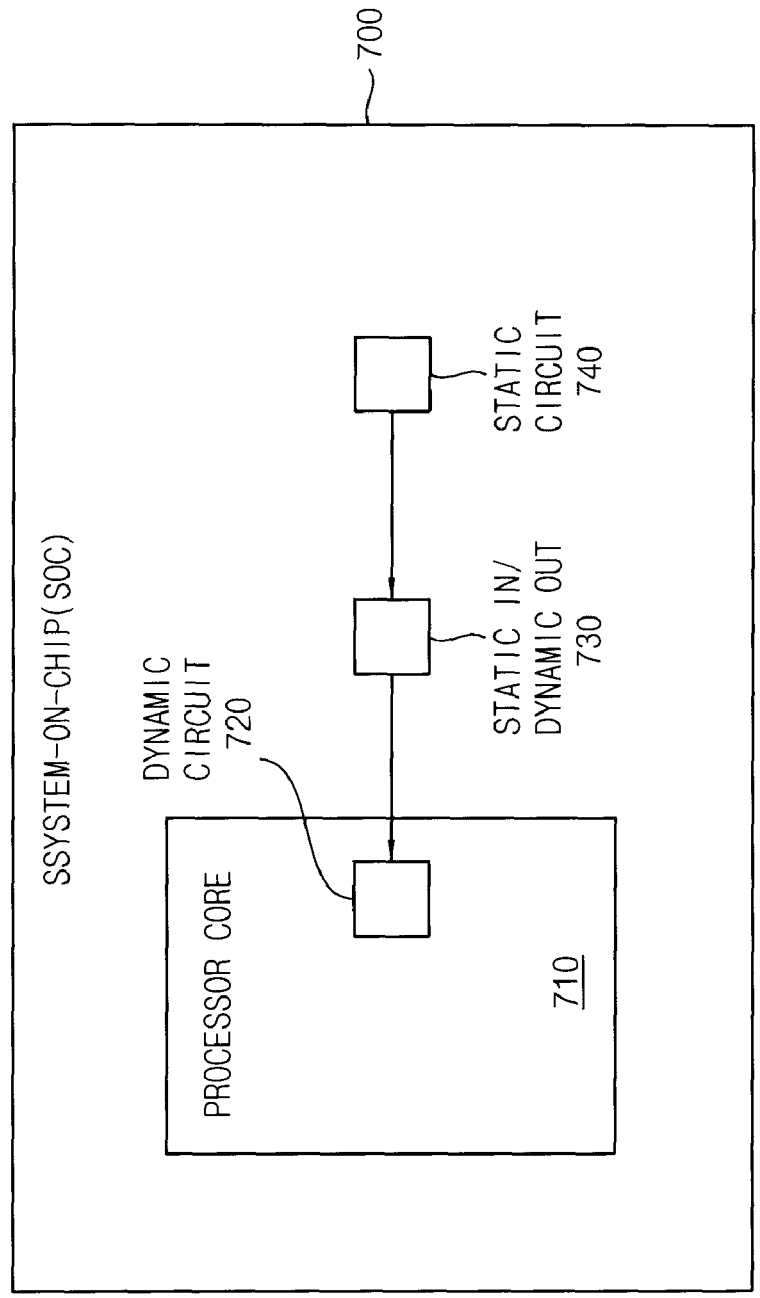
FIG. 7 illustrates a system-on-chip including a dynamic circuit according to the present general inventive concept.

FIG. 7 illustrates an example of a system-on-chip 700 including a dynamic circuit with a slow MUX input. A system-on-chip 700 may include one or more processor cores 710 and one or more logic and memory sections. The processor core 700 may include a dynamic circuit 720. The system-on-chip 700 may include at least one static circuit 740, or a circuit that receives and outputs static signals. The system-on-chip 700 may also include a dynamic circuit having a slow MUX input 730 to receive static input signals and to output dynamic signals to the dynamic circuit according to the present general inventive concept.

The dynamic circuit with a slow MUX input, or semi-dynamic flip-flop, may be used in any circuitry of the system-on-chip. For example, the semi-dynamic flip-flop circuit may be used in a translation lookaside buffer (TLB), which is a CPU cache used by memory management hardware to improve virtual address translation speed. As another example, the semi-dynamic flip-flop may be used in an arithmetic logic unit (ALU), which is circuitry included in or connected to a processor to perform arithmetic and logical operations.

Figure 8:
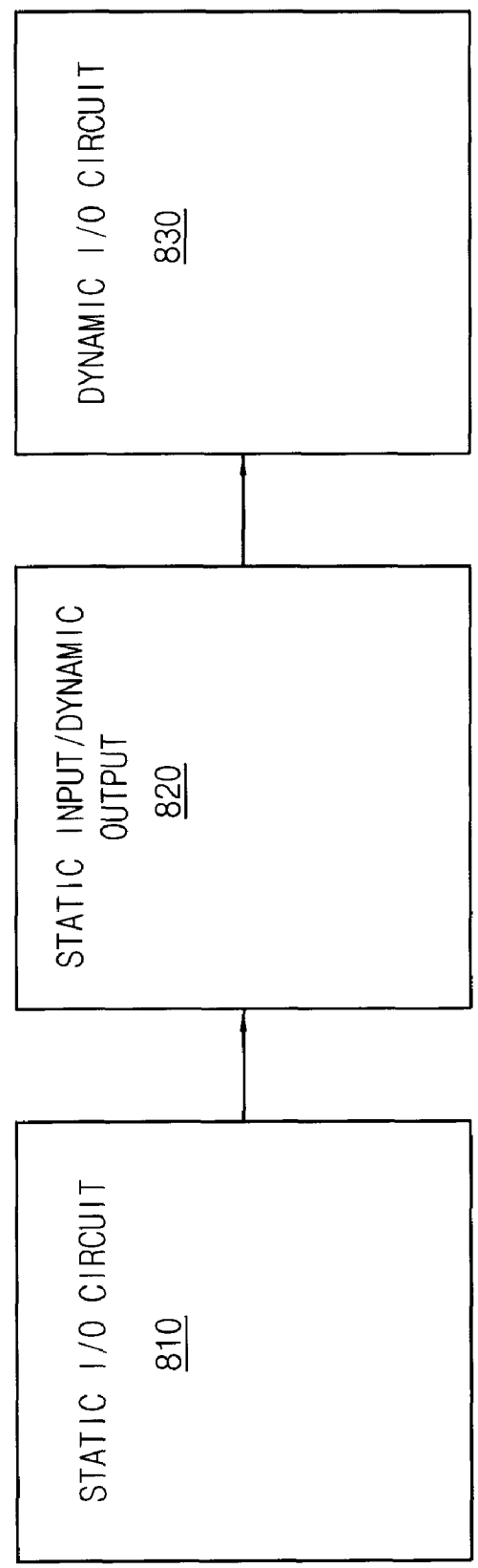
FIG. 8 includes a block diagram illustrating a function of the present general inventive concept.

FIG. 8 includes a block diagram illustrating a function of a dynamic circuit having a slow MUX input according to an embodiment of the present general inventive concept. A circuit 820 according to the present general inventive concept may receive one or more static input signals from a static I/O circuit 810. As discussed in the embodiments above, the static input/dynamic circuit 820 may utilize at least one pulse signal to adjust an output signal in a dynamic manner. The output signal from the dynamic circuit having a slow MUX input 820 may output the output signals to the dynamic I/O circuit 830, which is designed to receive and output signals in a dynamic manner.

Figure 9:
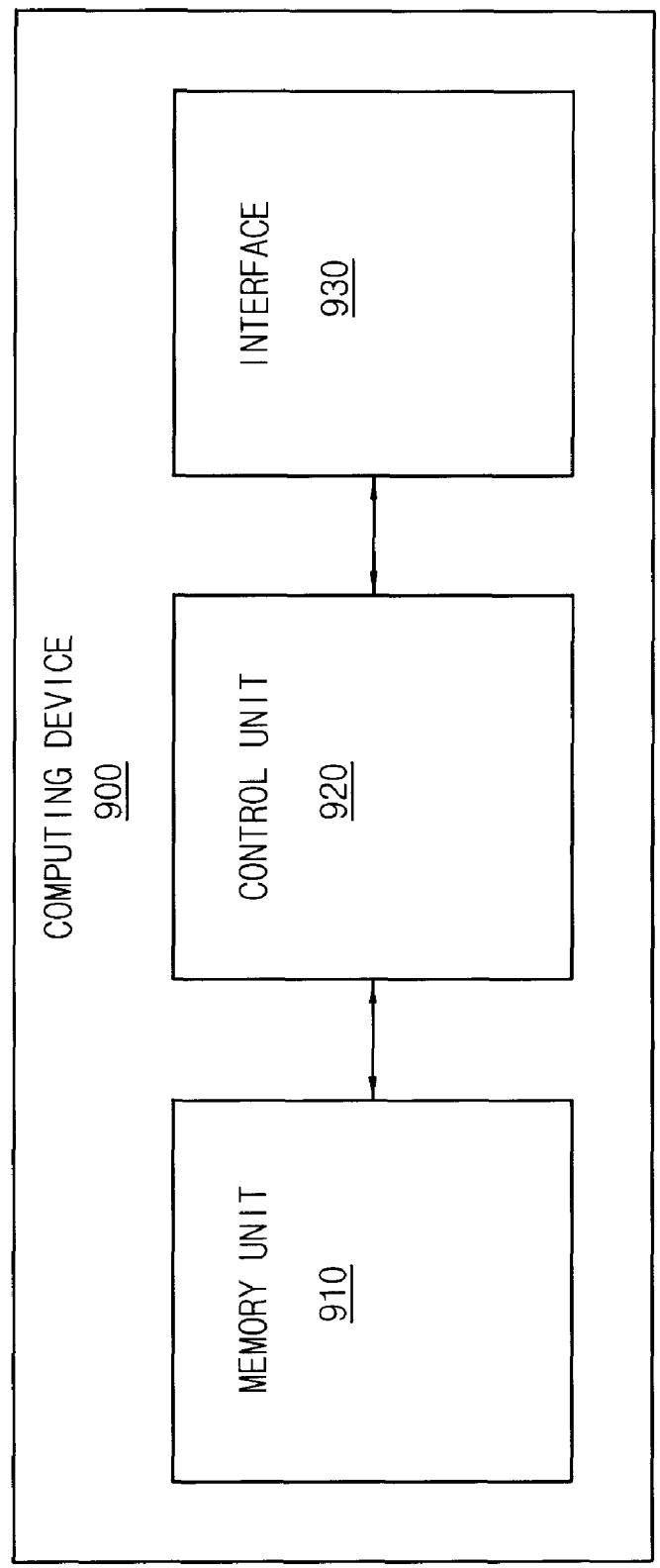
FIG. 9 illustrates a block diagram of a computing device including a dynamic circuit according to the present general inventive concept.

FIG. 9 illustrates an example of a computing device 900 that may include a dynamic circuit having a slow MUX input according to an embodiment of the present general inventive concept. The computing device 900 may include at least one memory unit 910, at least one control unit 920, and at least one interface 930. The memory unit 910 may include one or more memory chips and supporting logic to store data. The interface 930 may include one or more user interface modules, such as keyboards, buttons, knobs, dials, displays, or any other user interface. In addition, the interface 930 may include one or more ports including wired ports and wireless ports or antenna to communicate with external devices. The control unit 920 may include one or more processors or processing modules to control and transmit data between the memory unit 910, the control unit 920, and the interface 930.

Although a few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. A logic circuit comprising:
   a control circuit comprising a first logic gate to receive a selection signal and a first input signal and to output a pulse control signal and a second logic gate to receive the pulse control signal, a clock signal, and a delayed clock signal and to output a pulse signal; and
   a multiplexing logic circuit to receive the selection signal and the pulse signal from the control circuit, to receive at least one second, static input signal, and to output a signal corresponding to one of the first input signal and the second, static input signal based on the state of the selection signal.

2. The logic circuit according to claim 1, wherein the first input signal is a slow input signal.

3. The logic circuit according to claim 1, wherein:
   the first and second logic gates are NAND gates; and
   the delayed clock signal is generated by a buffer comprising a plurality of inverters connected in series to receive the clock signal and to output the delayed clock signal.

4. The logic circuit according to claim 1, wherein the multiplexing logic circuit comprises:
   a logic unit to receive the static input;
   a first NMOS transistor connected in parallel with the logic unit, a gate of the first NMOS transistor connected to a line to carry the selection signal; and
   a second NMOS transistor connected in series with the parallel combination of the first NMOS transistor and the logic unit and connected to a line to carry the pulse signal,
   wherein each of the first NMOS transistor and the logic unit includes a first lead connected to an electrical node corresponding to an output of the logic circuit,
   each of the first NMOS transistor and the logic unit includes a second lead connected to a first lead of the second NMOS transistor, and
   the second NMOS transistor includes a second lead connected to ground.

5. The logic circuit according to claim 4, wherein the first input corresponds to a signal from the electrical node.

6. The logic circuit according to claim 5, further comprising:
   an output latch including first and second inverters connected input-to-output, a first input-to-output connection connected to the electrical node and a second input-to-output connection corresponding to the first input of the control circuit.

7. The logic circuit according to claim 6, further comprising:
   a latch circuit to receive an input signal from the second input-to-output connection of the output latch and to output a signal to the first input of the control circuit.

8. The logic circuit according to claim 1, further comprising a pre-charge circuit to pre-charge the electrical node corresponding to an output of the logic circuit.

9. The logic circuit according to claim 1, further comprising:
   a first output latch to receive a signal from the electrical node corresponding to the output of the logic circuit and to output a signal to the electrical node corresponding to the signal received from the electrical node signal; and
   an output buffer to receive the signal from the electrical node and to output a corresponding output signal.

10. The logic circuit according to claim 1, further comprising:
    a first output latch to receive a signal from the electrical node corresponding to the output of the logic circuit and to output a signal to the electrical node corresponding to the signal received from the electrical node signal; and
    a second output latch to receive the signal from the electrical node and a timing signal and to output an output signal.

11. The logic circuit according to claim 10, wherein the second output latch comprises:
    a first PMOS transistor and first and second NMOS transistors connected in series between power and ground, the first PMOS transistor and the second NMOS transistor receiving as gate inputs the signal from the electrical node and the first NMOS transistor receiving as a gate input signal the timing signal; and
    two inverters connected input-to-output, a first input-to-output connection connected between a drain of the first PMOS transistor and a source of the first NMOS transistor, and a second input-to-output connection outputting an output signal from the logic circuit.

12. The logic circuit according to claim 11, wherein the timing signal is the clock signal.

13. The logic circuit according to claim 11, wherein the timing signal is a second pulse signal generated by the control circuit.

14. A logic circuit comprising:
    a control circuit to receive a first input signal, a clock signal, and a selection signal, to output the selection signal, and to output a pulse signal based on the clock input signal and a pulse control signal; and
    a multiplexing logic circuit receive the selection signal and the pulse signal from the control circuit, to receive at least one second, static input signal, and to output a signal corresponding to one of the first input and the second, static input based on the state of the selection signal, the multiplexing logic circuit comprising:
    a logic unit to receive the static input;
    a first NMOS transistor connected in parallel with the logic unit, a gate of the first NMOS transistor connected to receive the selection signal; and
    a second NMOS transistor connected in series with the parallel combination of the first NMOS transistor and the logic unit, and connected to receive the pulse signal,
    wherein each of the first NMOS transistor and the logic unit includes a first lead connected to an electrical node corresponding to an output of the logic circuit,
    each of the first NMOS transistor and the logic unit includes a second lead connected to a first lead of the second NMOS transistor, and
    the second NMOS transistor includes a second lead connected to ground.

15. The logic circuit according to claim 14, wherein the control circuit includes a pulse-generator circuit to generate the pulse signal.

16. The logic circuit according to claim 15, wherein the pulse-generator circuit comprises:
    a first logic gate to receive the selection signal and the first input and to output the pulse control signal; and a second logic gate to receive the pulse control signal, the clock signal, and a delayed clock signal and to output the pulse signal.

17. A method of performing a multiplexing operation, the method comprising:
receiving a first input signal, a selection signal, and a clock signal at a control circuit;
generating a pulse control signal based on the first input signal and the selection signal;
generating a pulse signal based on the pulse control signal;
receiving at least one static input signal, the selection signal, and the pulse signal at a MUX logic circuit, the MUX circuit including a first transistor connected in parallel with a logic unit, the first transistor receiving at its gate the selection signal and the logic unit receiving as an input the at least one static input signal; and
outputting from the MUX logic circuit a first output signal corresponding to one of the first input signal and the static input signal based on a state of the selection signal.

18. The method according to claim 17, wherein the first input signal is a slow input signal.

19. The method according to claim 17, wherein:
generating the pulse control signal includes receiving at a NAND logic gate each of the first input signal and the selection signal to output the pulse control signal from the NAND logic gate;
generating the delayed clock signal includes passing the clock signal through a buffer; and
generating the pulse signal includes receiving each of the pulse control signal, the clock signal, and the delayed clock signal into a NAND logic gate.

20. The method according to claim 17, wherein the first input signal is connected to the output of the MUX logic circuit.

21. The method according to claim 17, wherein a rise of the pulse signal corresponds to a respective rise of the clock signal.

22. The method according to claim 17, wherein the first transistor is a first NMOS transistor and
the MUX logic circuit further comprises:
a second NMOS transistor connected in series with the parallel combination of the first NMOS transistor and the logic unit,
wherein each of the first NMOS transistor and the logic unit includes a first lead connected to an electrical node corresponding to an output of the logic circuit,
each of the first NMOS transistor and the logic unit includes a second lead connected to a first lead of the second NMOS transistor,
the second NMOS transistor includes a second lead connected to ground, and the method further comprises:
outputting the pulse signal to a gate of the second NMOS transistor.

23. The method according to claim 22, further comprising: pre-charging the electrical node during a low portion of the clock signal.

24. The method according to claim 23, wherein pre-charging the electrical node comprises:
inputting the clock signal to a gate of a PMOS transistor connected in series with the combination of the logic unit and first NMOS transistor connected in parallel.

25. The method according to claim 17, further comprising:
receiving the first output signal and a timing signal as inputs to a latch input; and
outputting from the latch a second output signal corresponding to the first output signal.

26. The method according to claim 25, wherein the timing signal is the pulse signal.

27. The method according to claim 25, wherein the latch comprises:
a first PMOS transistor and first and second NMOS transistors connected in series between power and ground; and
two inverters connected input-to-output, a first input-to-output connection connected between a drain of the first PMOS transistor and a source of the first NMOS transistor,
wherein the method further comprises:
receiving the signal from the electrical node at gates of the first PMOS transistor and the second NMOS transistor;
receiving the timing signal at a gate of the first NMOS transistor;
inputting a third output signal to the first input-to-output connection; and
outputting the second output signal from the second input-to-output connection.

28. A method of performing a multiplexing operation, the method comprising:
receiving a first input signal, a selection signal, and a clock signal at a control circuit;
generating a pulse control signal based on the first input signal and the selection signal;
generating a pulse signal corresponding to an output of a NAND logic gate, the NAND logic gate receiving as inputs the clock signal, a delayed clock signal, and the pulse control signal;
receiving at least one static input signal, the selection signal, and the pulse signal as inputs of a MUX logic circuit; and
outputting from the MUX logic circuit a first output signal corresponding to one of the first input signal and the static input signal based on a state of the selection signal.

29. A semiconductor chip including at least one logic circuit, the logic circuit comprising:
a control circuit comprising a first logic gate to receive a selection signal and a first input signal and to output a pulse control signal and a second logic gate to receive the pulse control signal, a clock signal, and a delayed clock signal and to output a pulse signal; and
a multiplexing logic circuit to receive the selection signal and the pulse signal from the control circuit, to receive at least one second, static input signal, and to output a signal corresponding to one of the first input signal and the second, static input signal based on the state of the selection signal.

30. A computing device, comprising:
memory to store data; and
at least one controller to read data from and write data to the memory,
wherein at least one of the memory and controller includes a logic circuit, the logic circuit comprising:
a control circuit comprising a first logic gate to receive a selection signal and a first input signal and to output a pulse control signal and a second logic gate to receive the pulse control signal, a clock signal, and a delayed clock signal and to output a pulse signal; and
a multiplexing logic circuit to receive the selection signal and the pulse signal from the control circuit, to receive at least one second, static input signal, and to output a signal corresponding to one of the first input signal and the second, static input signal based on the state of the selection signal.

* * * * *

UNITED STATES PATENT AND TRADEMARK OFFICE
CERTIFICATE OF CORRECTION

| | | |
|---|---|---|
| PATENT NO. | : 7,982,503 B2 | Page 1 of 1 |
| APPLICATION NO. | : 12/814635 | |
| DATED | : July 19, 2011 | |
| INVENTOR(S) | : Min-Su Kim | |

It is certified that error appears in the above-identified patent and that said Letters Patent is hereby corrected as shown below:

On the Title Page, insert
Item --(30) Foreign Application Priority Data
June 16, 2009 (KR).......10-2009-0053304--

Signed and Sealed this
Twenty-second Day of July, 2014

Michelle K. Lee
*Deputy Director of the United States Patent and Trademark Office*